United States Patent [19]

Miyaka et al.

[11] 4,181,563
[45] Jan. 1, 1980

[54] PROCESS FOR FORMING ELECTRODE PATTERN ON ELECTRO-OPTICAL DISPLAY DEVICE

[75] Inventors: Kenji Miyaka, Kunitachi; Hisao Noro, Tokorozawa, both of Japan

[73] Assignee: Citizen Watch Company Limited, Tokyo, Japan

[21] Appl. No.: 890,909

[22] Filed: Mar. 28, 1978

[30] Foreign Application Priority Data

Mar. 31, 1977 [JP] Japan .................................. 52-36595
Jan. 26, 1978 [JP] Japan .................................. 53-7676

[51] Int. Cl.² .............................................. C23F 1/02
[52] U.S. Cl. .................................... 156/643; 156/656; 219/121 LM; 350/336; 427/53.1; 427/165; 427/271; 427/287
[58] Field of Search ............... 156/643, 651, 645, 656, 156/659, 667; 350/160 LC; 96/36.2, 38.4; 29/591; 219/121 L, 121 LM; 427/53, 88, 164–166, 271, 287, 282; 428/1; 340/334–336

[56] References Cited

U.S. PATENT DOCUMENTS

| | | | |
|---|---|---|---|
| 3,740,523 | 6/1973 | Cohen et al. | 156/643 X |
| 3,928,658 | 12/1975 | Van Boxtel et al. | 156/656 X |

*Primary Examiner*—William A. Powell
*Attorney, Agent, or Firm*—Sherman & Shalloway

[57] ABSTRACT

A process for forming a transparent electrode pattern on a substrate such as a glass sheet which constitutes an electro-optical display device such as a liquid crystal display element in which a transparent semi-electrode pattern comprising at least two individual segment electrodes of indium oxide connected to each other without any clearance defined therebetween is formed on one side of said substrate by photo-resist patterning or the like and said semi-electrode pattern is processed by YAG laser ray application so as to provide the clearance between said individual segment electrodes to thereby provide an excellent transparent electrode pattern.

7 Claims, 8 Drawing Figures

PROCESS FOR FORMING ELECTRODE PATTERN ON ELECTRO-OPTICAL DISPLAY DEVICE

BACKGROUND OF THE INVENTION

This invention relates to a process for forming an electrode pattern on an electro-optical display device such as a liquid crystal display element and more particularly, to a process for forming such an electrode pattern having a precisely defined contour with a high operation efficiency.

DESCRIPTION OF THE PRIOR ART

A variety of processes for forming a transparent electrode pattern on the substrate of a liquid crystal cell or the like have been proposed and practically employed. As the prior art electrode pattern forming processes, the photo-resist patterning, resist print patterning, transparent conductive film mask vapor deposition and mask spray processes have been employed. However, these prior art electrode pattern forming processes have their inherent advantages and disadvantages respectively. That is, although the photo-resist patterning process can form a relatively precisely defined electrode pattern, the process requires a rather great number of processing steps and provides a low yield rate which leads to increase in the production cost of liquid crystal cells or the like.

The resist print and mask spray patterning processes can form liquid crystal cells or the like at less expense, but these processes have not yet been completely established enough to assure precisely defined electrode patterns having widths less than 0.1 mm in mass production system.

The mask vapor depositioned patterning process is inferior to the other processes with respect to cost and contour preciseness, and cannot be utilized in mass production system.

Furthermore in any one of the conventional liquid crystal cells, one of the upper and lower glass substrate which are disposed one upon another is formed with the so-called individual segment electrodes, the other glass substrate is formed with a common electrode and voltage is applied across the segment electrodes and common electrode to thereby provide a desired display. However, any display provided by the electrode arrangement referred to hereinabove lacks variety or is monotonous and aesthetically unsatisfactory and has insufficient contrast. As an improvement over the prior art liquid crystal display cells referred to hereinabove, the liquid crystal display cell employing comb-shaped electrodes has been proposed to thereby provide a color or high contrast display. However, the comb-shaped electrode-type liquid crystal display cell is more difficult in processing and substantially expensive as compared with the liquid crystal display cell employing the common electrode and segment electrodes. That is, in the production of the comb-shaped electrode-type liquid crystal cell, the individual segment electrodes arranged in conformity with a desired display pattern have to be further processed to comb-shaped sub-segment electrodes. Therefore, the distance between the adjacent electrodes inevitably becomes very small because the space on the substrate available for forming the electrodes is limited. As a result, since the electrode formation by only the conventional photo-resist patterning, resist print patterning or mask vapor deposition patterning process cannot perform a satisfactory precision patterning, it is apparent that shortcircuiting inevitably occurs between the electrodes and the yield rate for electrode formation is substantially low.

SUMMARY OF THE INVENTION

Therefore, a main object of the present invention is to provide a process for forming an excellent electrode pattern which can effectively eliminate all the disadvantages inherent in the conventional transparent conductive film wiring patterning processes.

Another object of the present invention is to provide a process for forming a precisely defined and high quality electrode pattern on an electro-optical display device at low cost by laser ray treatment.

A further object of the present invention is to provide a process for forming an electrode pattern including comb-shaped segment electrodes which were in practice difficult to be formed by the conventional electrode pattern forming processes.

According to the present invention, these objects are attained by a process which comprises in combination the steps of forming a transparent semi-electrode pattern having individual segment electrodes connected to each other on one side of a glass substrate which constitutes an electro-optical display device by applying a transparent conductive film on said substrate side and applying laser ray to said semi-electrode pattern so as to remove said transparent conductive film at the area defined between said segment electrodes to thereby separate the segment electrodes from each other.

The above and other objects and attendant advantages of the present invention will be more readily apparent to those skilled in the art from a reading of the following detailed description in conjunction with the accompanying drawings which show preferred embodiments of the invention for illustration purpose only, but not for limiting the scope of the same in any way.

PREFERRED EMBODIMENT OF THE INVENTION

Figure 1:
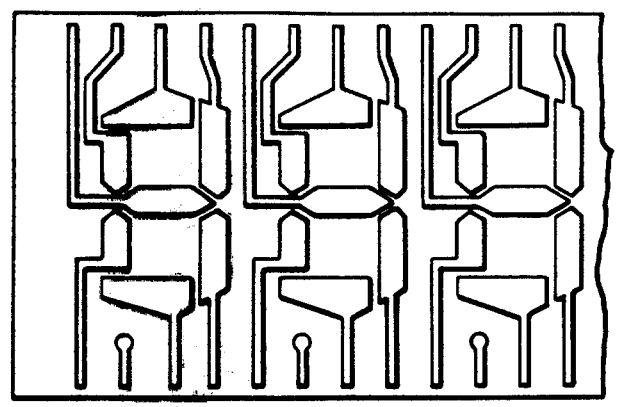
FIG. 1 is a fragmentary plan view of the conventional transparent electrode pattern formed on a glass substrate which constitutes a liquid crystal display element.
Figures 2, 3:
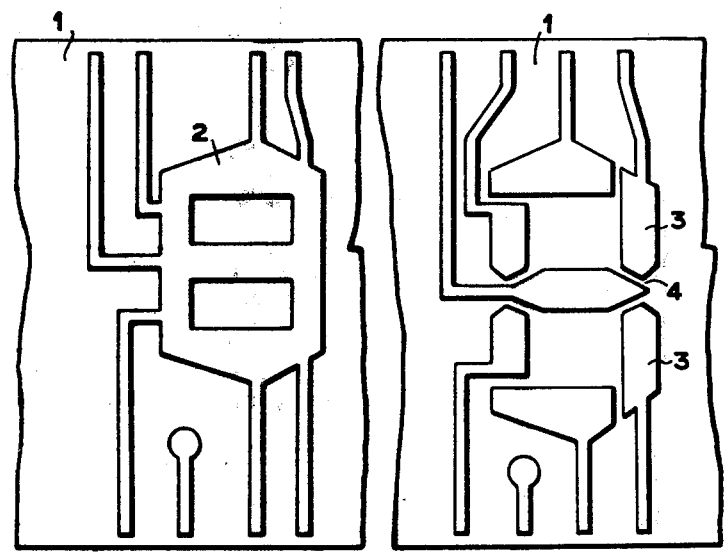
FIG. 2 is a fragmentary plan view on an enlarged scale of a semi-electrode pattern formed by one embodiment of the process of the present invention.
FIG. 3 is similar to FIG. 2, but shows a complete electrode pattern formed by said embodiment of the process of the present invention.

The present invention will be now described referring to the accompanying drawings. FIG. 1 is a plan view of the conventional transparent electrode pattern formed on one of two glass substrates which in combination constitute a liquid crystal display element. FIG. 2 is a fragmentary plan view on an enlarged scale of a semi-electrode pattern formed by a step in one embodiment of the process according to the present invention and FIG. 3 is a similar view which shows a complete electrode pattern formed by a further step in the one embodiment of the process according to the present invention.

In the formation of an electrode pattern according to the first embodiment of the process, a glass sheet 1 having a transparent electrically conductive film of indium oxide applied to one side thereof is provided as the substrate and a so-called transparent semi-electrode pattern 2 is formed on the conductive film applied side of the glass substrate by the conventional resist print patterning process. In the semi-electrode pattern 2 formed on the glass substrate, the individual adjacent segments 3 are connected to each other with the clearance 4 therebetween as required in the complete electrode pattern (FIG. 3) eliminated from the pattern.

The semi-electrode pattern 2 formed on the glass substrate is then subjected to a laser ray treatment YAG (yttrium-aluminum-gahnite) to melt away the area of the transparent conductive film which corresponds to the clearance 4 to be formed between the adjacent individual segments 3 in the complete electrode pattern to thereby separate the segments from each other as shown in FIG. 3 resulting in the formation of the complete or final transparent electrode pattern on the glass substrate. The dimensions of the clearance 4 can be optionally varied by adjusting the flux of light in the laser ray.

The glass substrate having the transparent electrode pattern formed thereon in the manner mentioned hereinabove was employed to constitute a liquid crystal display element and tested for determining its various characteristics to obtain good results.

More particularly, according to the present invention, a fine or very small clearance less than 50 μm between the adjacent segments can be easily provided. The clearance having such small size could not be provided by the conventional patterning processes because there was the possibility of shortcircuiting between the adjacent segments. Furthermore, according to the present invention, a display element having excellent appearance and quality, and high reliability in its displaying mode can be produced. Thus, in the embodiment of the display element adapted to display numerals referred to hereinabove; displays similar to numerals in which the segments in the lighting condition are seemingly connected to each other can be obtained. When the present invention is applied to the formation of relatively complicate transparent electrode patterns such as ⊞ shape and ⊠ shape which are employed in the display of the days of the week in English letters, it is apparent that the above-mentioned characteristics of the electrode pattern are far superior to those of the conventional electrode patterns of the corresponding shapes.

The transparent semi-electrode pattern 2 as shown in FIG. 2 can be formed by the optical resist patterning, mask vapor deposition or mask spray process other than the above-mentioned resist printing process.

However, as in the embodiment of the present invention referred to hereinabove, when the process of the present invention is employed in combination with the relatively less expensive resist printing process, an electrode pattern of fine quality can be produced at low cost.

Figure 4A:
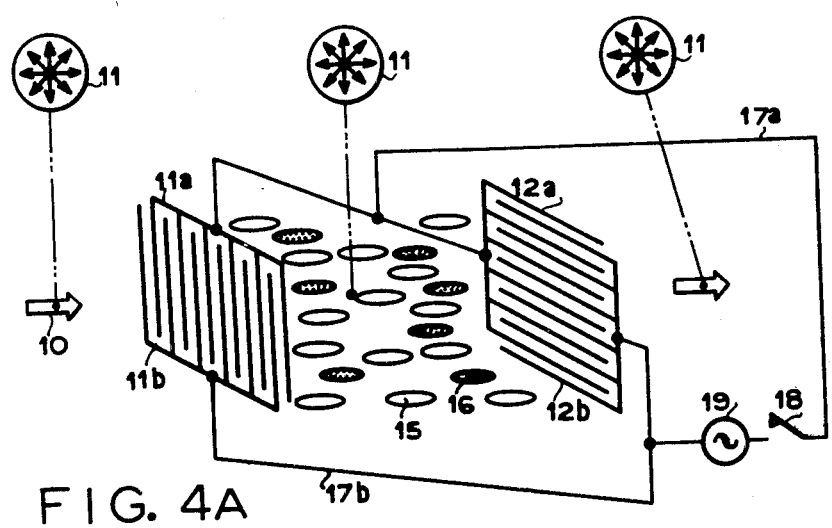
FIGS. 4A and 4B are views showing the operation principle of one example of a liquid crystal display cell in which comb-shaped electrodes are employed.
Figure 4B:
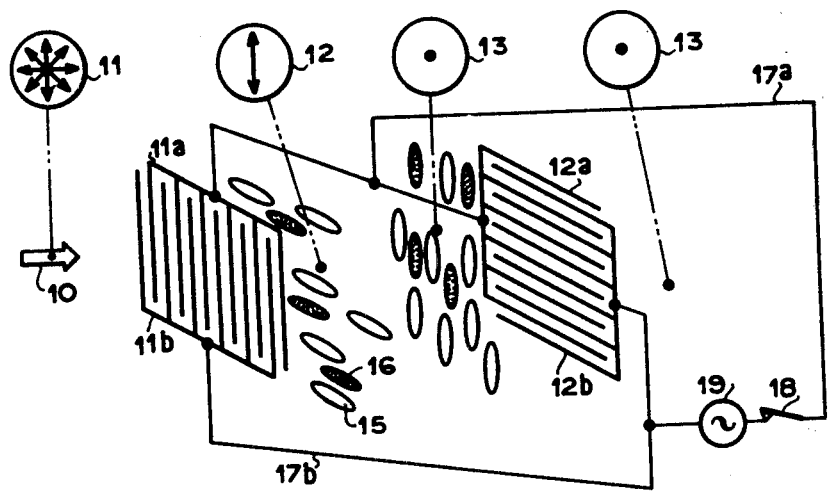

The second embodiment of the process by the present invention in which an electrode pattern comprising comb-shaped electrodes is formed on a glass substrate will be now described referring to FIGS. 4A and 4B. These figures show the operation principle of one example of the novel liquid crystal display cell in which comb-shaped electrodes are employed. In this type of liquid crystal display cell intended to improve contrast, a first pair of comb-shaped electrodes are provided on one side of a first transparent substrate, a second pair of similar comb-shaped electrodes are provided on one side of a second similar transparent substrate, the first and second transparent substrates are disposed in spaced and parallel relationship with the first pair of electrodes and second pair of electrodes opposing and extending at right angles to each other, respectively, dichroism nematic liquid crystal or dichroism nematic liquid crystal and dichroism color matter are disposed between the first and second transparent substrates and a voltage is applied across the opposing electrodes so as to display an information by electro-optical effects (gest-host effects in a wide sense).

In the liquid crystal display cell as shown in FIGS. 4A and 4B, a first pair of comb-shaped electrodes 11a and 11b are provided on one side of a first transparent substrate (not shown) and a second pair of comb-shaped electrodes 12a and 12b are provided on one side of the second transparent substrate (not shown), respectively. The first and second transparent substrates are disposed in spaced and parallel relationship with the first pair of electrodes 11a, 11b and the corresponding second pair of electrodes 12a, 12b opposing and extending at right angles or substantially right angles to each other and nematic liquid crystal 15 having a positive conductive anisotropy and dichroism color matter 16 are provided between the first and second transparent substrates in homeotropic orientation with respect to the two substrates. The comb-shaped electrode 11a in the first pair of comb-shaped electrodes 11a, 11b and the comb-shaped electrode 12a in the second pair of electrodes 12a, 12b are connected to a switch 18 through a lead 17a whilst the other electrodes 11b and 12b in the first and second pairs of electrodes are connected to a power source 19 through a lead 17b. In the condition of the liquid crystal cell shown in FIG. 4A, the switch 18 is open and no voltage is applied across the respectively adjacent electrodes on the two transparent substrates.

When natural incidence light enters the cell with the components of the cell in the condition of FIG. 4A, the omnidirectional oscillation vector 11 of the light leaves the cell having the omnidirectional oscillation vector because the dichroism color matter 16 is in the homeotropic orientation with respect to the electrodes and the light absorption axis of the cell is parallel to the advancing direction of the light whereby the oscillation vector 11 is not absorbed by the cell, and as a result, a bright display is provided by the cell.

In the condition of the cell shown in FIG. 4B, the switch 18 is closed and a voltage is applied across the respectively adjacent electrodes. In this condition of the cell, since a voltage is applied across the comb-shaped electrodes 11a and 11b, an electric field extending in a horizontal direction is provided whereby the nematic liquid crystal 15 having a positive dielectric anisotropy adjacent to the first transparent substrate is orientated in horizontal directions and as the result, the dichronism color matter 16 adjacent to the first transparent substrate is also orientated in horizontal directions. Since a voltage is also applied across the comb-shaped electrodes 12a, 12b, an electric field extending in a vertical direction is provided and the nematic liquid crystal 15 having a positive dielectric anisotropy and the dichronism color matter 16 adjacent to the second transparent substrate are also orientated in vertical directions.

When natural incident light enters the cell in the condition of the cell in FIG. 4B, the horizontal omnidirectional oscillation vector of the light is absorbed by the cell because the dichronism color matter 16 adjacent to the first transparent substrate is orientated in a horizontal direction and the light absorption axis is also orientated in a horizontal direction and thus, the light becomes a linear biasing light having a vertical oscillation vector 12. As the linear biasing light approaches the second substrate, the vertical vector 12 of the light is absorbed by the cell because the dichronism color matter 16 is orientated laterally and the light absorption axis of the cell extends in the vertical direction and the light goes out as having the zero vector 13 whereby a dark display is provided by the cell.

With the construction and arrangement of the components of the liquid crystal cell referred to hereinabove, a liquid crystal cell having a substantially improved contrast can be obtained. However, as compared with the electrodes of the conventional liquid crystal cells, the comb-shaped electrodes in the cell as shown in FIGS. 4A and 4B have the disadvantages that they encounter difficulty in the manufacture thereof and are substantially high in production cost.

Figure 6:
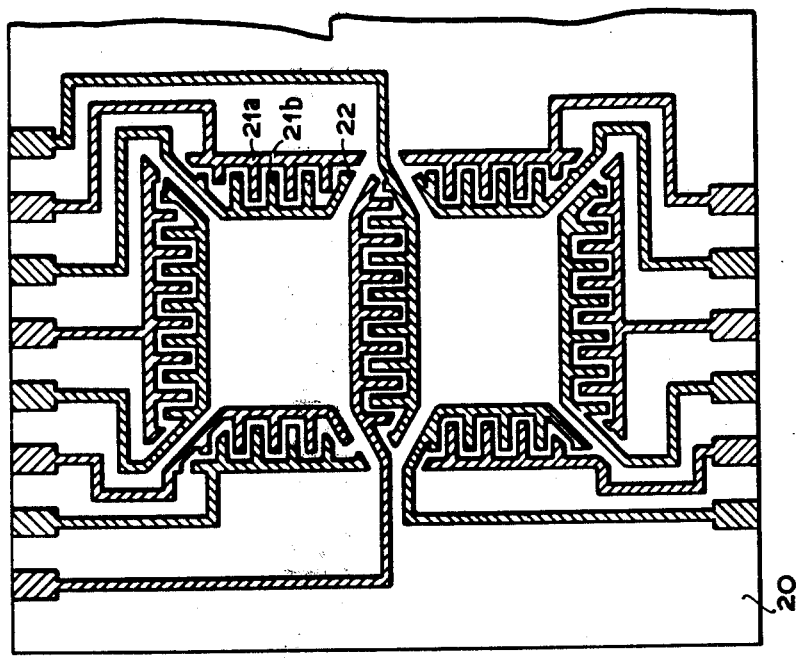
FIG. 6 is similar to FIG. 5, but shows a complete electrode pattern formed by said another embodiment of the process.
Figure 5:
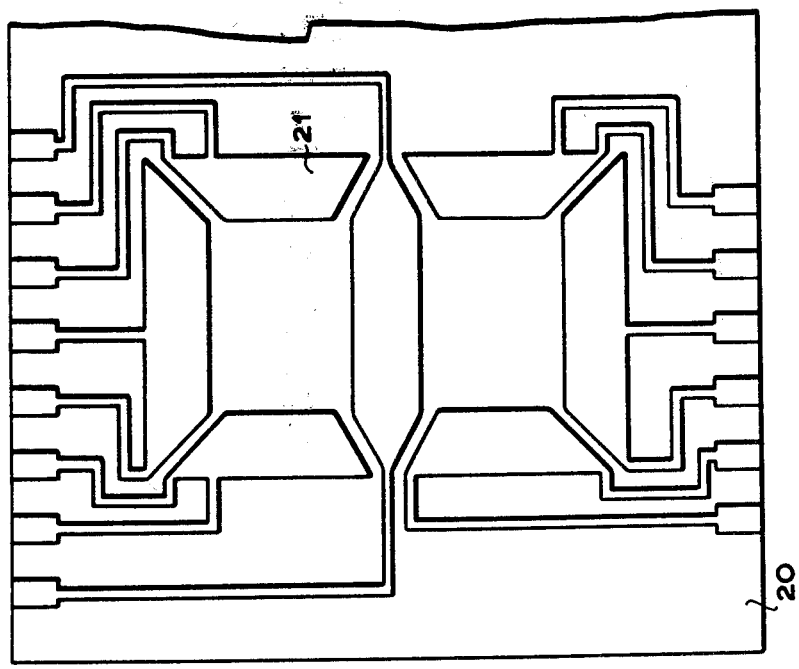
FIG. 5 is a fragmentary plan view of a semi-electrode pattern fromed by another embodiment of the process of the present invention.
Figure 7:
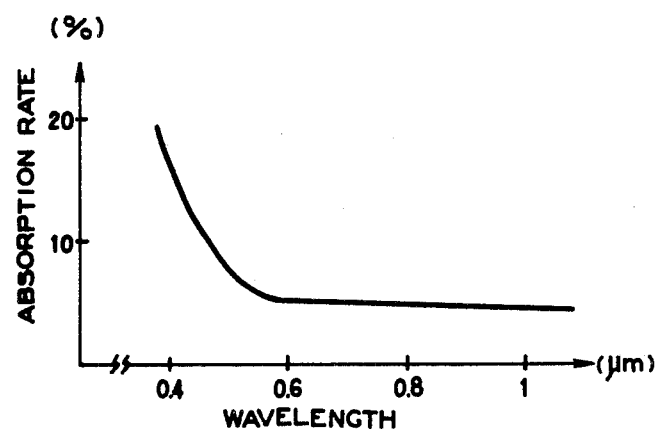
FIG. 7 is a diagram showing the light absorption characteristics of a transparent electrode film formed of indium oxide.

FIG. 5 is a plan view of a semi-electrode pattern comprising comb-shaped electrodes formed by a step in the second embodiment of the process according to the present invention and FIG. 6 is a plan view of a complete comb-shaped electrode pattern formed by a further step in the second embodiment of the process. In FIG. 5, reference numeral 20 denotes the glass substrate of a liquid crystal cell and a semi-display electrode pattern 21 is formed on one side of the glass substrate. The semi-display electrode pattern 21 may be formed by any one of the conventional electrode forming processes such as the photo-resist patterning, resist print patterning or mask vapor deposition process which is employed in the formation of the conventional cell electrode patterns. When the semi-electrode pattern is formed by the photo-resist patterning process, for example, a transparent conductive film is vapor deposited on entire side of the glass base 20 where the electrode pattern has been formed, a photo-resist agent is applied on the film by means of a spinner or the like and the conductive film and photo-resist agent are then prebaked to dry and fix the photo-resist agent. Thereafter, the electrode pattern formed side of the glass base 20 is masked leaving the semiformed electrode pattern unmasked and the electrode pattern is then exposed to light. The exposed electrode pattern is developed to remove the photo-resist agent from the area of the electrode pattern formed side of the glass substrate except for the area where the semi-electrode pattern has been formed and the remaining photo-resist agent is postbaked so as to divide the area of the semi-electrode pattern 21 into the individual comb-shaped segments as shown in FIG. 6. Although laser ray generally passes through a transparent article and the transparent article cannot be processed by laser ray, the transparent electrodes formed of indium oxide or tin oxide in a liquid crystal cell in fact include a visual light zone and has a limited light absorption characteristic at the area extending from the ultraviolet ray zone to the infrared ray zone. FIG. 7 is a diagram showing the light absorption characteristic of a transparent electrode film formed of indium oxide ($In_2O_3$) and having the thickness of 0.1 $\mu$m and in this diagram, the abscissa represents the wave length of light and the ordinate represents the light absorption rate, respectively. As clear from this figure, the transparent electrode film of the liquid crystal cell has the light absorption characteristics on the order of several % for even lights having wave lengths over 0.5 $\mu$m. And experiments have shown that since the transparent electrode film itself has a very small thickness, the conventional stationary laser ray can easily melt away the transparent electrode film. However, in the wave length range from below 0.5 $\mu$m to the ultraviolet ray, since the light absorption rate of the glass substrate itself is high, if the transparent electrode is processed by laser rays within this wave length range, the electrode film formed side of the glass substrate is vulnerable to damage and care must be paid in the processing of the transparent electrode film by the use of such laser rays. Thus, in practice, the laser ray processing is preferably perfomed by the use of laser rays having wave lengths over 0.6 $\mu$m. Experiments have shown that when YAG ($Y_3Al_5O_{12}$=yttrium-aluminum-gahnite) laser ray having the wave length of 1.06 $\mu$m within the ultrared ray zone is employed, for example, a satisfactory transparent electrode film processing can be performed. In a practical processing operation, the glass substrate 20 having the semi-electrode pattern 21 formed on one side thereof as shown in FIG. 2 is positioned in a laser ray processing device and a laser ray is scanned along the contour of the semi-electrode pattern 21 to divide the electrode pattern into the individual comb-shaped segments as shown in FIG. 6 so as to complete the toothed electrodes 21a, 21b. In such a case, the laser ray scanning is performed by the NC (numeral control) or the like.

Thus, according to the second embodiment of the process referred to just above, the clearance 22 between the comb-shaped electrodes 21a, 21b or the width of the scanning trace of the laser ray can be easily controlled to values below 10 $\mu$m. And furthermore, there is no possibility that shortcircuiting occurs between the electrodes 21a, 21b and the electrodes can be positively separated.

The present invention can be applied to other types of liquid crystal cells provided that such cells are electro-optical display devices and also applied to display devices employing elements other than liquid crystal such as electro-chromism or the like.

And although description has been made on the transparent conductive film formed of indium oxide, the transparent conductive film formed of tin oxide, for example, can be equally processed by the process of the present invention.

While preferred embodiments of the invention have been shown and described in detail, it will be understood that the same are for illustration purpose only and not to be taken as a definition of the invention, reference being had for this purpose to the appended claims.

What is claimed is:

1. A process for forming an electrode pattern on an electro-optical display device having a substrate comprising the steps of:

(a) forming a transparent semi-electrode pattern having adjacent segments connected to each other said forming including the step of
(b) applying a transparent conductive film of indium oxide on one side of the substrate; and
(c) applying a laser ray having a wavelength greater than 0.6 μm to a selected area between the segments of said semi-electrode pattern to remove said transparent conductive film thereby forming a non-conductive area at said selected area.

2. The process for forming an electrode pattern as set forth in claim 1, in which the step of applying the transparent conductive film is performed by a resist printing process.

3. The process for forming an electrode pattern as set forth in claim 1, in which said laser ray is comprised of YAG ($Y_3Al_5O_{12}$=yttrium-aluminum-gahnite) laser ray.

4. The process for forming an electrode pattern as set forth in claim 1, in which said electro-optical display device is a liquid crystal display cell.

5. The process for forming an electrode pattern as set forth in claim 1, in which said transparent semi-electrode pattern formed by said transparent conductive film application step is an electrode pattern including at least two continuous segments.

6. The process for forming an electrode pattern as set forth in claim 1, in which said transparent semi-electrode pattern formed by said transparent conductive film application step comprises individual segments and said electrode pattern formed by said laser ray application is a comb-shaped electrode pattern.

7. The process for forming an electrode pattern as set forth in claim 1, in which said transparent conductive film application comprises the steps of:
(a) vapor depositing a transparent conductive film on one entire side of a glass substrate;
(b) applying a photo-resist agent on the entire area of said transparent conductive film;
(c) pre-baking said conductive film and photo-resist agent to dry and fix the photo-resist agent;
(d) exposing said glass substrate to light while masking the area of the substrate less the area thereof where a semi-electrode pattern is to be formed;
(e) developing said glass substrate to remove said photo-resist agent at said area of the substrate less said area thereof where said semi-electrode pattern is to be formed;
(f) post-baking the remaining portion of said photo-resist agent left in accordance with the contour of said semi-electrode pattern to be formed after said developing step to positively fix the photo-resist agent;
(g) etching said transparent conductive film at the area thereof where said photo-resist agent has been removed; and
(h) removing the remaining portion of said photo-resist agent.

* * * * *

UNITED STATES PATENT AND TRADEMARK OFFICE
CERTIFICATE OF CORRECTION

PATENT NO. : 4,181,563
DATED : January 1, 1980
INVENTOR(S) : Miyake, et al.

It is certified that error appears in the above-identified patent and that said Letters Patent are hereby corrected as shown below:

After item [75] on the cover page, delete "Inventors: Kenji Miyaka, Kunitachi; Hisao Noro, Tokorozawa, both of Japan" and insert -- Inventors: Kenji Miyake, Kunitachi; Hisao Noro, Tokorozawa, both of Japan --

Signed and Sealed this

Twenty-fifth Day of March 1980

[SEAL]

Attest:

SIDNEY A. DIAMOND

Attesting Officer

Commissioner of Patents and Trademarks